Figure 1:
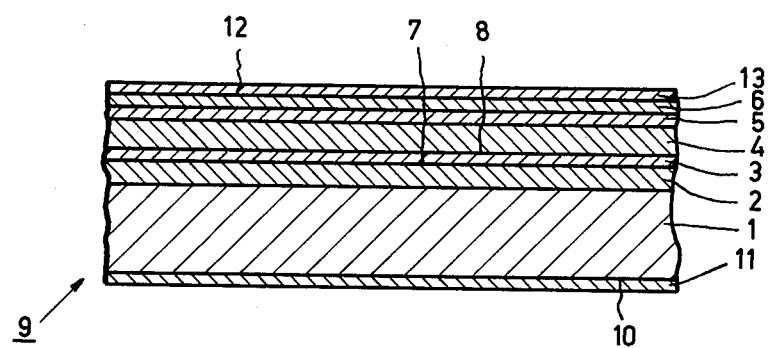

United States Patent [19]

Tijburg et al.

[11] 4,222,791
[45] Sep. 16, 1980

[54] METHOD OF MAKING HETEROJUNCTION DEVICES BY ACCURATE CONTROL OF GOLD PATTERN MASK AND PROTON BOMBARDMENT

[75] Inventors: Rudolf P. Tijburg; Teunis Van Dongen, both of Eindhoven, Netherlands

[73] Assignee: U.S. Philips Corporation, New York, N.Y.

[21] Appl. No.: 969,611

[22] Filed: Dec. 14, 1978

[30] Foreign Application Priority Data

Jan. 18, 1978 [NL] Netherlands ................. 7800583

[51] Int. Cl.² .................. H01S 3/00; H01L 21/225; H01S 3/18
[52] U.S. Cl. ........................ 148/1.5; 148/175; 357/18
[58] Field of Search ............. 148/1.5, 175; 357/18

[56] References Cited

U.S. PATENT DOCUMENTS

| 3,824,133 | 7/1974 | D'Asaro ........................... 148/1.5 |
| 3,982,207 | 9/1976 | Dingle et al. .................. 331/94.5 H |
| 4,124,826 | 11/1978 | Dixon et al. .................. 331/94.5 H |
| 4,138,274 | 2/1979 | Dyment ........................... 148/1.5 |

OTHER PUBLICATIONS

Foyt et al., "Isolation . . . in GaAs . , . Proton Bombardment," Solid St. Electronics, 12 (1969), 209.
Harris et al., ". . . S/C Injection Lasers," IBM-TDB, 16 (1973), 171.

*Primary Examiner*—L. DeWayne Rutledge
*Assistant Examiner*—Upendra Roy
*Attorney, Agent, or Firm*—Thomas A. Briody; Jack Oisher; Paul R. Miller

[57] ABSTRACT

A method of manufacturing a device in which a surface of a body is provided with a gold layer masking against a proton bombardment, in which the gold pattern is formed by means of a photoetching process, the gold pattern is removed after the subsequent proton bombardment of the body. The masking gold layer is obtained by providing on the body a quantity of gold simultaneously with a quantity of an addition which is small as compared with the quantity of gold.

11 Claims, 2 Drawing Figures

METHOD OF MAKING HETEROJUNCTION DEVICES BY ACCURATE CONTROL OF GOLD PATTERN MASK AND PROTON BOMBARDMENT

The invention relates to a method of manufacturing a device in which a surface of a body is provided with a layer of gold masking against a proton bombardment in which a gold pattern is formed by a photoetching process, the gold pattern masks against subsequent proton bombardment of the body, after which the gold pattern is removed. The invention also relates to a device manufactured by means of this method.

A prior method is disclosed in U.S. Pat. No. 3,824,133. This prior patent describes the manufacture of a laser diode having two hetero junctions between which the active layer is positioned.

The laser diode is manufactured by successively depositing a number of layers of semiconductor materials on a substrate, after which a pattern of gold paths is formed on the last-deposited layer and a proton bombardment is carried out so that a change in structure occurs in the layers at the area of the bombardment. This change makes the layers electrically insulating at the area of bombardment and defines the width of the laser diodes at the area of the gold paths.

The edges of the gold paths show irregularities of approximately 1 $\mu$m size so that the width of the gold paths is substantially restricted to dimensions of at least 3 $\mu$m. These irregularities possibly originate from crystallites of the gold layer and there exists a correlation between such irregularities and the size of the crystallite.

One of the objects of the invention is to reduce the irregularities at least to a considerable extent. It is based inter alia on recognition of the fact that the size of the crystallites of gold can be changed without other favorable properties of the gold being adversely influenced.

According to the invention, a masking gold layer is obtained by providing on the body a quantity of gold simultaneously with a quantity of an addition which is small as compared with the quantity of gold.

The irregularities in the gold pattern are considerably reduced by such additions.

It has been found that additions of 0.1 to 10% by weight of the total quantity of material provided for the gold layer has a significantly favourable effect on the irregularities.

Tin or gallium are preferably used as an addition. With an addition of ½% by weight of gallium or ¼% by weight of tin, irregularities of approximately ¼$\mu$m are found so that useful gold paths of 2 $\mu$m width can be obtained.

The method according to the invention may be used in the manufacture of semiconductor devices, such as for example laser diodes.

It is also known to provide gold contacts on semiconductor devices with small additions of dopants so as to obtain non-rectifying contacts on a semiconductor body. As compared herewith, the invention has proved that small additions can also be extremely useful if the gold pattern does not serve for a contact but only as a mask.

It is also known to use a gold pattern as a masking pattern for wet-etching silicon. Additions to the gold are then used to improve the adhesion of the etching mask to the silicon in the etching bath. As compared herewith, the invention has proved that small additions may also be useful if the gold pattern does not serve as a masking layer during wet-etching of semiconductor material.

The formation of the gold pattern is preferably succeeded by a proton bombardment so as to obtain insulating regions in a semconductor body.

Good electrically insulating and passivating properties prove to be associated with the variations in structure occurring by the proton bombardment at the area.

The body is preferably obtained by depositing epitaxial layers comprising an active laser layer on a substrate and the gold pattern is formed on the last-deposited epitaxial layer after which insulating regions are formed by the proton bombardment which at least partly bound laser regions situated below paths in the gold pattern.

The proton bombardment is usually carried out so that in order to avoid undesired recombination phenomena protons are provided in the body up to a very small distance above the active layer.

In another embodiment of the method according to the present invention, the formation of the gold pattern is succeeded by a proton bombardment so as to obtain selectively etchable regions, after which regions are etched selectively.

Such a method may be used, for example, in garnet materials to obtain magnetic memories. During the etching treatment succeeding the proton bombardment the gold pattern need no longer be present.

The invention will now be described in greater detail with reference to an example and the accompanying drawing.

Figure 2:
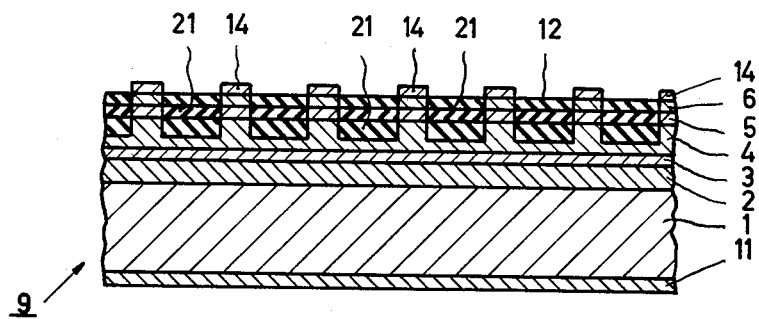

In the drawing, FIGS. 1 and 2 are sectional views of a number of devices in successive stages of manufacture by means of the method according to the invention.

In the following example the manufacture will be described of a number of laser diodes from a disk of semiconductor material.

Starting material is an n-type gallium arsenide substrate 1 which is provided in a usual manner with a 2 $\mu$m thick n-type gallium aluminum arsenide layer 2, a 0.3 $\mu$m thick p-type gallium arsenide layer 3, a 1.5 $\mu$m thick p-type gallium aluminum arsenide layer 4, a 0.5 $\mu$m thick p-type gallium arsenide layer 5 and a 0.5 $\mu$m thick P+ type gallium arsenide layer 6.

The hetero junction 7 is present between the layers 2 and 3 and the hetero junction 8 is present between the layers 3 and 4. Layer 3 is the active layer.

The substrate 1 is etched thin from a thickness of 400 $\mu$m to 11 $\mu$m. The substrate 1 and the layers 2 to 6 constitute the body 9.

Side 10 of the body 9 is provided with a gold-germanium-nickel contact layer 11.

The surface 12 of the body 9 is provided, for example by vapour deposition, with a 2 $\mu$m thick layer of gold 13 masking against proton bombardment, in which layer a gold pattern 14 is formed by means of a photoetching process.

The gold pattern 14 masks in a subsequent proton bombardment of the body 9, after which the gold pattern 14 is removed.

According to the invention the masking gold layer 13 is obtained by providing, for example vapour-depositing, on the body 9 a quantity of gold simultaneously with a quantity of an addition or additive which is small compared with the quantity of gold.

This additive is preferably 0.1 to 10% by weight of the total quantity of material provided for the gold layer.

Tin in a quantity of ¼% by weight or gallium in a quantity of ½% by weight are preferably used as an additive.

The pattern 14 consists of gold paths of 2 μm width and a mutual distance of approximately 300 μm. Irregularities during etching the gold paths are less than ¼ μm.

Bombardment is carried out with a proton beam having an energy of 150 kV for 50 minutes and a proton flow of $10^{12}$ per cm$^2$/sec. of the surface 12.

Insulating regions 21 are obtained. In the present case the insulating regions bound laser regions below paths 14 in the gold pattern down into the layer 4.

After removing the gold pattern the surface 12 is provided with a usual electrode layer, the body 9 is severed in laser diodes with the insulating regions 21 and further processed in a usual manner to laser devices.

The method according to the invention is not restricted to the example described.

The surface of the body on which the gold layer is provided, for example, may itself be formed by a metal layer. For example, a semiconductor body is provided with a chromium layer or a chromium layer and a platinum layer, after which the gold layer is provided. The chromium and platinum layers are usually thin and proton bombardment takes place with the last-mentioned layers in the semiconductor body.

In another preferred embodiment of the method according to the invention the proton bombardment serves to obtain selectively etchable regions which are then etched selectively. In such a method not only the etched region is accurately determined by the accurate mask but substantially no undercutting occurs either.

In addition to gallium or tin, many other types of additions or additives to gold may be used.

What is claimed is:

1. A method of manufacturing a device comprising the steps of forming a gold pattern mask of a combination of gold and a relatively small amount of an additive on a surface of a body by photoetching, subjecting said body to a proton bombardment through openings in said gold pattern mask, and removing gold pattern mask after said proton bombardment.

2. A method according to claim 1, wherein said additive constitutes an amount of 0.1 to 10% by weight of the total quantity of said gold pattern mask.

3. A method according to claim 1, wherein said steps of subjecting results in obtaining insulating regions in a semiconductor body.

4. A method according to claim 1, wherein said steps of subjecting said body to proton bombardment obtains selectively etchable regions, said regions being etched selectively after said step of subjecting.

5. A method according to claim 1, wherein said additive is tin in an amount of ¼% by weight.

6. A method according to claim 1, wherein said additive is gallium in an amount of ½% by weight.

7. A method according to claim 2, wherein said additive is tin or gallium.

8. A method according to claim 7, wherein said additive is tin in an amount of ¼% by weight.

9. A method according to claim 7, wherein said additive is gallium in an amount of ½% by weight.

10. A method according to claim 3, wherein said semiconductor body is obtained by the steps of depositing on a substrate epitaxial layers including at least one active laser layer, said gold pattern mask being formed as the last deposited layer of said epitaxial layers, and wherein said insulating regions are formed by said proton bombardment, said insulating regions bounding at least partly laser regions situated below said gold pattern mask.

11. A product formed by the method of manufacturing a device comprising the steps of forming a gold pattern mask of a combination of gold and a relatively small amount of an additive on a surface of a body by photoetching, subjecting said body to a proton bombardment through openings in said gold pattern mask, and removing said gold pattern mask after said proton bombardment.

* * * * *